United States Patent
Katagiri

(10) Patent No.: US 8,555,231 B2
(45) Date of Patent: Oct. 8, 2013

(54) AUTOMATIC WIRING DEVICE, AUTOMATIC WIRING METHOD, AND AUTOMATIC WIRING PROGRAM

(75) Inventor: Hideaki Katagiri, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 225 days.

(21) Appl. No.: 12/458,102

(22) Filed: Jun. 30, 2009

(65) Prior Publication Data

US 2010/0058273 A1    Mar. 4, 2010

(30) Foreign Application Priority Data

Sep. 1, 2008 (JP) ................................. 2008-224116

(51) Int. Cl.
*G06F 17/50* (2006.01)
(52) U.S. Cl.
USPC ............ 716/126; 716/111; 716/118; 716/119
(58) Field of Classification Search
USPC ........................................................ 716/126
See application file for complete search history.

(56) References Cited

U.S. PATENT DOCUMENTS

| | | | |
|---|---|---|---|
| 2003/0229862 A1* | 12/2003 | Li et al. | 716/1 |
| 2006/0123381 A1* | 6/2006 | Nakamura et al. | 716/21 |
| 2009/0037850 A1* | 2/2009 | Gray et al. | 716/2 |

FOREIGN PATENT DOCUMENTS

| | | |
|---|---|---|
| JP | 11-135724 | 5/1999 |
| JP | 2002-134618 | 5/2002 |
| JP | 2006-162955 | 12/2004 |
| JP | 2006-153306 | 6/2006 |
| JP | 2006-237440 | 9/2006 |
| JP | 2008-192962 | 8/2008 |

OTHER PUBLICATIONS

Japanese Office Action mailed Apr. 2, 2013 in corresponding Japanese Patent Application No. 2008-224116 (10 pages) (7 pages English Translation).

* cited by examiner

*Primary Examiner* — Vuthe Siek
*Assistant Examiner* — Eric Lee
(74) *Attorney, Agent, or Firm* — Staas & Halsey LLP

(57) ABSTRACT

An automatic wiring method includes calculating a metal area within an integrated circuit, and determining whether the metal area calculated at the calculating is smaller than a minimum metal area as a predetermined threshold value.

10 Claims, 7 Drawing Sheets

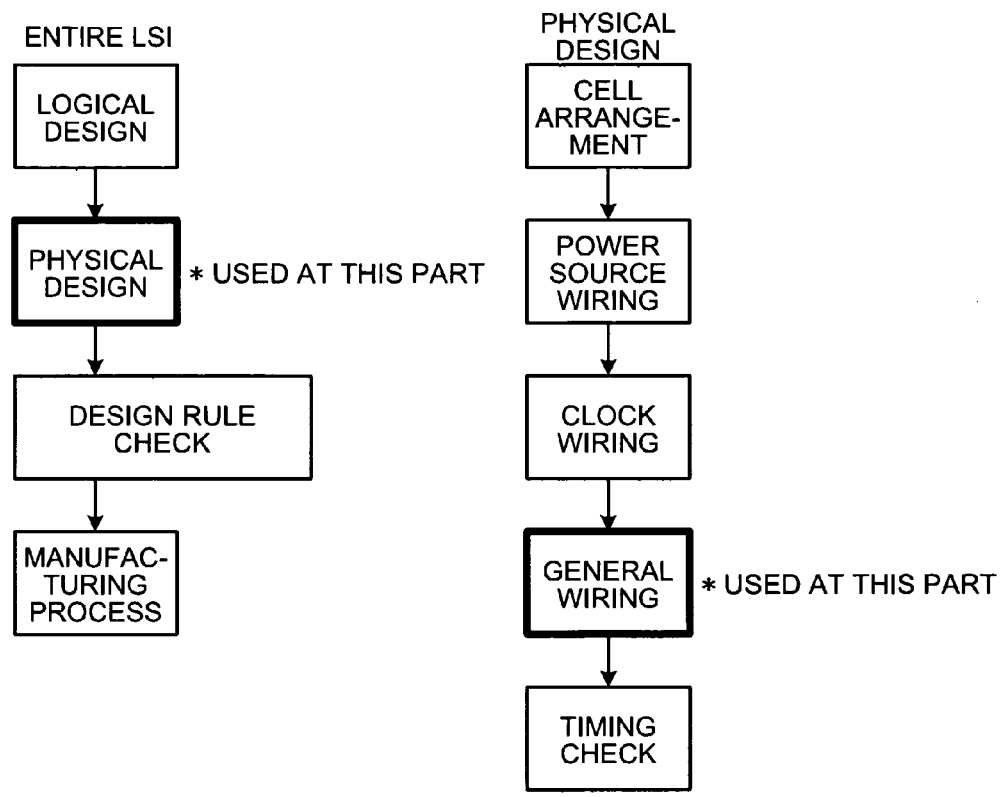

FIG.7

```
TARGET    OBJECT                        HOW TO
Net-Area  (0,0)-(1000,1000)             ViaChange
Net-Area  (2500,2500)-(30000,30000)     PatternChange
..............................................
..............................................
..............................................
```

FIG.8

```
TARGET    OBJECT                        HOW TO
Area      (0,0)-(1000,1000)             ViaChange
Area      (2500,2500)-(30000,30000)     PatternChange
..............................................
..............................................
..............................................
```

FIG.9

```
TARGET    OBJECT    HOW TO
Lay       LA-LD     ViaChange
Lay       LE-LH     PatternChange
.......................................
.......................................
.......................................
```

FIG.10

```
TARGET     OBJECT                        HOW TO           PRIORITY
Area       (0,0)-(1000,1000)             ViaChange        3
Area       (2500,2500)-(30000,30000)     PatternChange    4
Lay        LA-LD                         ViaChange        5
Lay        LE-LH                         PatternChange    6
Net-Name   A1                            ViaChange        1
Net-Name   B1                            PatternChange    2
..............................................
..............................................
..............................................
```

FIG.16

| VIA | LAY | WIRE WIDTH | PERMIT |
|---|---|---|---|
| Via1 | LA | 100 | 120 |
| Via1 | LA | 180 | 70 |
| Via1 | LB | 100 | 120 |
| Via1 | LB | 180 | 70 |
| ......................................... | | | |
| ......................................... | | | |
| ......................................... | | | |

AUTOMATIC WIRING DEVICE, AUTOMATIC WIRING METHOD, AND AUTOMATIC WIRING PROGRAM

CROSS-REFERENCE TO RELATED APPLICATION(S)

This application is based upon and claims the benefit of priority of the prior Japanese Patent Application No. 2008-224116, filed on Sep. 1, 2008, the entire contents of which are incorporated herein by reference.

FIELD

The embodiments discussed herein are directed to an automatic wiring device, an automatic wiring method, and an automatic wiring program for wiring an integrated circuit.

BACKGROUND

Recently, high-density designing of large-scale integrated circuit (LSI) is used to be achieved by downsizing its chip size. Because the area of wiring and via metal is reduced due to such high-density design, a minimum metal area error has become a significant issue. The minimum metal area error is a phenomenon that, because a metal area of wiring and via holes is smaller than a predetermined threshold value (that is, minimum metal area), exposure cannot be performed, and thus the LSI cannot be manufactured. The minimum metal area is determined as a design rule (design standard) for each semiconductor technology.

As a conventional technique of preventing the minimum metal area error, a technique of checking the length of each wire with reference to a library has been known (see Japanese Laid-open Patent Publication No. 11-135724). Specifically, a library that stores a safe length of a wire for connecting between upper and lower wiring layers through via holes is created in advance (see FIG. 16), and it is checked whether the length of each wire connected through via holes is equal to or larger than values listed in the library (values in the column of "PERMIT" in the example of FIG. 16).

According to the conventional technique, a library needs to be created in advance. Therefore, it takes time and labor to create the library based on a design rule determined for each semiconductor technology to which the design rule is to be applied. Because the length of each wire is simply checked with reference to the library, the entire metal area of an LSI cannot be controlled to a preferable limit, and high density cannot be achieved. Consequently, there has been a problem that the productivity of semiconductors decreases.

Further, according to the technique of preventing a minimum metal area error by the library, the library is updated each time the design rule is changed. Therefore, a calculation error can occur at the time of updating the library, and the minimum metal area error cannot be properly prevented.

SUMMARY

According to an aspect of the invention, an automatic wiring device includes a wiring unit that performs wiring based on connection information of a circuit in an integrated circuit, a wiring-metal-area calculating unit that calculates a metal area of wires wired by the wiring unit, and a minimum-metal-area determining unit that determines whether the metal area calculated by the wiring-metal-area calculating unit is smaller than a minimum metal area as a predetermined threshold value.

According to another aspect of the invention, an automatic wiring method includes calculating a metal area within an integrated circuit, and determining whether the metal area calculated at the calculating is smaller than a minimum metal area as a predetermined threshold value.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWING(S)

FIG. 2 is a schematic diagram for explaining a flow of an LSI design process;

FIG. 3 is an example of a parameter file;

FIG. 4 is another example of the parameter file;

FIG. 5 is still another example of the parameter file;

FIG. 6 is still another example of the parameter file;

FIG. 7 is still another example of the parameter file;

FIG. 8 is still another example of the parameter file;

FIG. 9 is still another example of the parameter file;

FIG. 10 is still another example of the parameter file;

FIG. 16 is an example of a library according to a conventional technique.

DESCRIPTION OF EMBODIMENT(S)

Exemplary embodiments of an automatic wiring device, an automatic wiring method, and an automatic wiring program according to the present invention will be explained below in detail with reference to the accompanying drawings.

A configuration of an automatic wiring device according to a first embodiment of the present invention and a process flow in the first embodiment are explained below in this order, and thereafter, effects of the first embodiment are explained. An example of application of an automatic wiring device to a computer-aided design system (CAD) device or the like is explained below.

[Configuration of Automatic Wiring Device]

Figure 1:
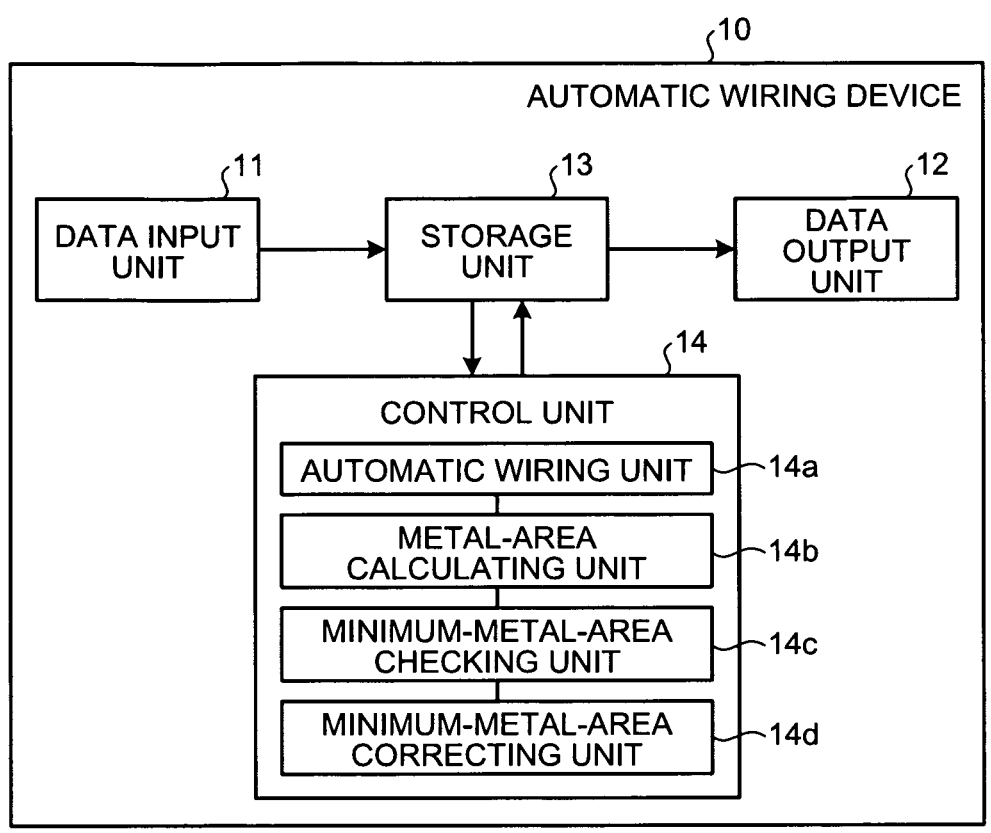
FIG. 1 is a block diagram of a configuration of an automatic wiring device according to a first embodiment of the present invention.

First, a configuration of an automatic wiring device 10 is explained with reference to FIG. 1. FIG. 1 is a block diagram of the configuration of the automatic wiring device 10 according to the first embodiment. As illustrated in FIG. 1, the automatic wiring device 10 includes a data input unit 11, a data output unit 12, a storage unit 13, and a control unit 14. Processes of these units are explained below.

The data input unit 11 inputs a net list or the like as connection information of connection between cells, and includes a keyboard, a mouse, a microphone or the like. The data output unit 12 outputs information concerning wiring within a net which is corrected to avoid occurrence of a minimum metal error, and outputs a graphic data system (GDS) or the like as a manufacturing format. The data output unit 12 includes a monitor, or a display, a touch panel and the like.

A process in which the automatic wiring device 10 is used in an entire flow of an LSI design process is explained. As illustrated in FIG. 2, as the entire flow of an LSI design process, a logical design, a physical design, and a design rule check are performed to generate a GDS as a format of a manufacturing process. An LSI is manufactured in the manufacturing process based on the generated GDS. The automatic wiring device 10 is used at a stage of the physical design in the flow.

A flow of the physical design is explained. As illustrated in FIG. 2, a physical design process is performed in the order of a cell arrangement, a power source wiring, a CLOCK wiring, a general wiring, and a timing check. The cell arrangement is a process of arranging cells constituting a circuit. The source wiring is a process of wiring to supply power to cells. The CLOCK wiring is a process of wiring to supply a clock to cells. The general wiring is a process of performing wiring to input and output terminals of cells. The timing check is a process of checking whether a circuit having a wiring arrangement operates in a preferable operation frequency. The automatic wiring device 10 is used to perform the general wiring among these processes. That is, in the automatic wiring device 10, information concerning the design of an LSI in each process (for example, a net list as wiring information) is input, and this information is stored in the storage unit 13 described later.

Referring back to FIG. 1, the storage unit 13 is a memory that stores various data input from the data input unit 11 and data and programs are used for various processes to be performed by the control unit 14. Particularly, the storage unit 13 stores parameter files that designate correction methods of correcting a wiring of the LSI based on a design rule.

Detailed examples of parameter files are explained with reference to FIG. 3 to FIG. 10. As illustrated in FIGS. 3 to 10, these parameter files store units to be corrected ("TARGET" in the examples illustrated in the drawings), objects to which correction methods are applied ("OBJECT" in the examples illustrated in the drawings), and correction methods for correcting the wiring of the LSI ("HOW TO" in the examples illustrated in the drawings), by relating these items to each other, respectively.

As methods of correcting the wiring of the LSI, the parameter files store a method of changing a type of via holes to obtain a metal area equal to or larger than a minimum metal area (ViaChange), a method of adding a wiring to obtain a metal area equal to or larger than a minimum metal area (AddMetal), and a method of changing a wiring pattern to obtain a metal area equal to or larger than a minimum metal area (PatternChange). These parameter files are explained below.

In the parameter file illustrated in FIG. 3, parameters are described in one net unit. For example, the parameter file stores the correction method "ViaChange" for changing a type of via holes to a net name "Al".

In the parameter file illustrated in FIG. 4, parameters are described in a net type unit. For example, the parameter file stores the correction method "ViaChange" for changing a type of via holes to a net type "CLOCK".

In the parameter file illustrated in FIG. 5, parameters are described in a used-wiring layer unit. In the parameter file illustrated in FIG. 6, parameters are described in a fan-out unit, which represents branching of a wiring driven by a cell output.

In the parameter file illustrated in FIG. 7, parameters are described in a wiring region unit by designating XY coordinates to designate a net. That is, parameters are described with respect to a net within a wiring region (area) designated by XY coordinates described in the parameter file.

In the parameter file illustrated in FIG. 8, parameters are described in a wiring region (area) unit designated by XY coordinates in a similar manner to that in the above example. In the parameter file illustrated in FIG. 9, parameters are described in a wiring layer unit in which wiring is performed.

As illustrated in FIG. 10, the parameter file can store priority orders during an application period ("PRIORITY" in the example illustrated in FIG. 10), together with units which designate objects to be corrected, the objects to be corrected, and correction methods. The parameter file stores smaller numbers for objects having higher priorities of application. According to this parameter file, wiring of the LSI is corrected in the order of objects having high priority of application by a minimum-metal-area correcting unit 14d.

The control unit 14 includes an internal memory that stores programs prescribing various process procedures, and data, thereby performing various processes. Particularly, the control unit 14 includes an automatic wiring unit 14a, a metal-area calculating unit 14b, a minimum-metal-area checking unit 14c, and the minimum-metal-area correcting unit 14d.

The automatic wiring unit 14a reads information concerning design of the LSI stored in the storage unit 13, performs wiring within all nets based on the read information, and notifies the wiring to the metal-area calculating unit 14b.

The metal-area calculating unit 14b calculates a metal area within the LSI. Specifically, the metal-area calculating unit 14b divides wires and via holes into blocks after the automatic wiring unit 14a performs wiring concerning the net. The metal-area calculating unit 14b calculates a metal area included in each divided block, and notifies a calculated result to the minimum-metal-area checking unit 14c.

Figure 11:
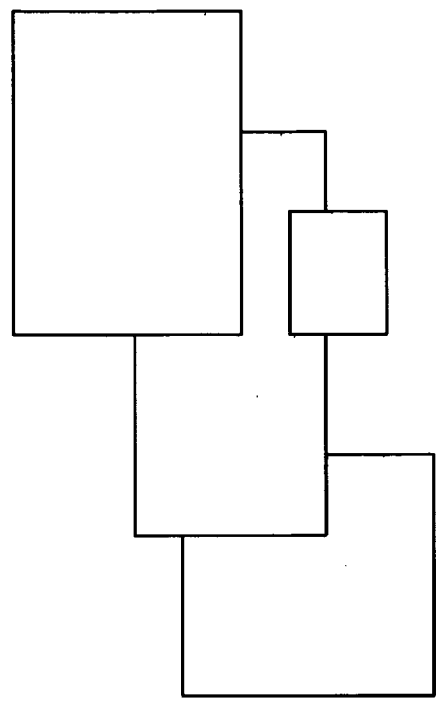
FIG. 11 is a schematic diagram for explaining a metal-area calculating process.
Figure 12:
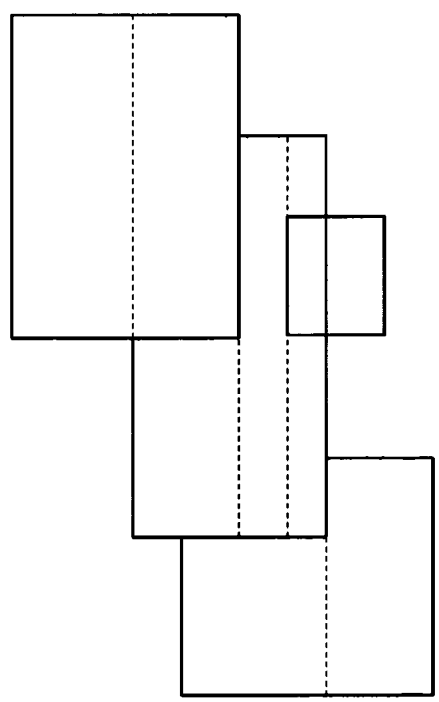
FIG. 12 is another schematic diagram for explaining the metal-area calculating process.

The above processing is explained in detail with reference to FIG. 11 to FIG. 13. In calculating a metal area of wiring and via holes illustrated in FIG. 11, the metal-area calculating unit 14b divides the metal area into blocks vertically, laterally, or both, and calculates these metal areas. That is, when the metal area of wiring and via holes is vertically divided into blocks, for example, the metal-area calculating unit 14b calculates areas of ten rectangles, respectively, and then calculates a total of the ten areas, as illustrated in FIG. 12.

Figure 13:
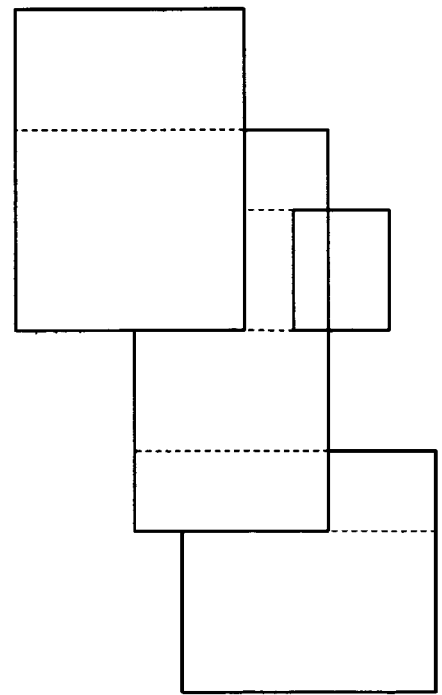
FIG. 13 is still another schematic diagram for explaining the metal-area calculating process.

Also when the metal area of wiring and via holes is laterally divided into blocks, the metal-area calculating unit 14b calculates metal areas of ten rectangles, respectively, and then calculates a total of the ten areas, as illustrated in FIG. 13.

Thus, even when wiring and via holes are overlapped in a complex configuration, the metal area can be easily calculated by dividing the area into rectangles.

The metal-area calculating unit 14b can also perform both vertical division and lateral division of a metal area of wiring and via holes into blocks and divide the metal area into a smaller number of rectangles, to calculate the metal area.

Referring back to FIG. 1, the minimum-metal-area checking unit 14c determines whether a calculated metal area is smaller than a minimum metal area as a predetermined threshold value. Specifically, the minimum-metal-area checking unit 14c checks whether there is a minimum metal area error, in other words, whether a calculated metal area is smaller than the minimum metal area as a predetermined threshold value.

The minimum-metal-area checking unit 14c determines whether there is a minimum metal area error, i.e., whether a calculated metal area is smaller than the minimum metal area as a predetermined threshold value, and notifies a result of the determination to the minimum-metal-area correcting unit 14d.

When it is determined that the metal area is smaller than the minimum metal area, the minimum-metal-area correcting unit 14d corrects the wiring of the LSI so that the metal area becomes equal to or larger than the minimum metal area. Specifically, when the minimum-metal-area correcting unit 14d receives from the minimum-metal-area checking unit 14c a result of the determination indicating that there is a minimum metal area error, the minimum-metal-area correcting unit 14d reads an external parameter from the storage unit 13.

The minimum-metal-area correcting unit 14d corrects the metal area according to the external parameter. This is explained with reference to the example illustrated in FIG. 3. When a name of a net in which the minimum metal area error is present is "Al", the minimum-metal-area correcting unit 14d performs the process of changing a type of via holes ("ViaChange"), and corrects the metal area. Thereafter, the minimum-metal-area correcting unit 14d checks the minimum metal area again. When all minimum metal area errors are corrected, the wiring taking the minimum metal area into consideration is completed.

[Process Performed by Automatic Wiring Device]

Figure 14:
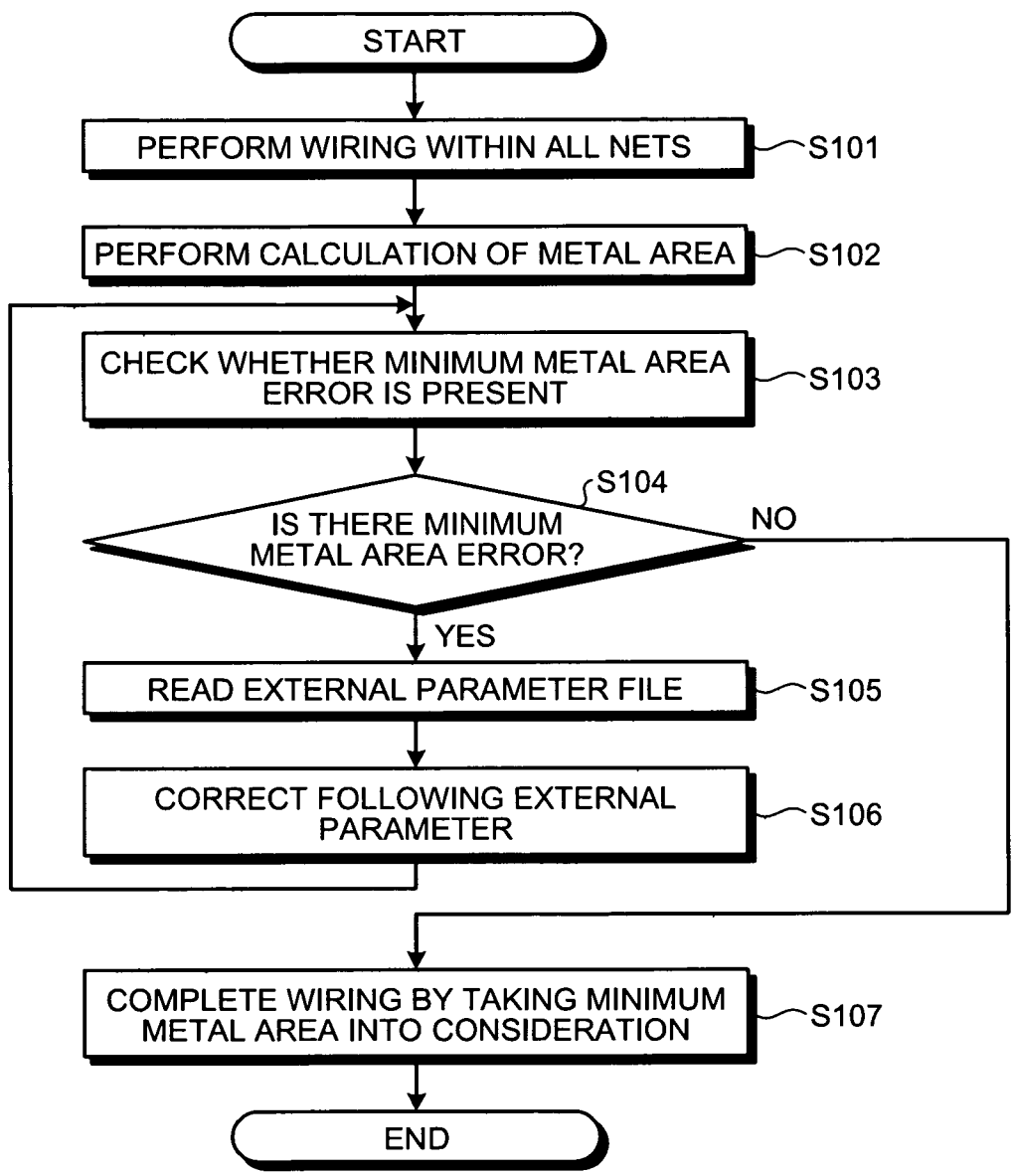
FIG. 14 is a flowchart of a process operation performed by the automatic wiring device according to the first embodiment.

The process performed by the automatic wiring device 10 is explained with reference to FIG. 14. FIG. 14 is a flowchart of a process operation performed by the automatic wiring device 10.

As illustrated in FIG. 14, the automatic wiring device 10 performs wiring within all nets based on information concerning the design of the LSI (Step S101), divides wiring and via holes into blocks, and calculates metal areas (Step S102). The automatic wiring device 10 checks whether there is a minimum metal area error that a calculated metal area is smaller than the minimum metal area as a predetermined threshold value (Step S103). The automatic wiring device 10 determines whether there is a minimum metal area error that a calculated metal area is smaller than the minimum metal area as a predetermined threshold value (Step S104).

When the automatic wiring device 10 determines as a result of the check that there is a minimum metal area error (YES at Step S104), the automatic wiring device 10 reads an external parameter from the storage unit 13 (Step S105) and corrects the minimum metal area following the external parameter (Step S106). Thereafter, the process returns to Step S103, and the automatic wiring device 10 repeats the process of correcting the minimum metal area until there is no minimum metal area error (Steps S102 to S106).

When the automatic wiring device 10 finally determines that there is no minimum metal area error (NO at Step S104), the wiring taking the minimum metal area into consideration is completed (Step S107).

Effects of First Embodiment

As described above, the automatic wiring device 10 calculates a metal area within the LSI, and determines whether the calculated metal area is smaller than the minimum metal area as a predetermined threshold value. Therefore, the automatic wiring device 10 checks whether an actual metal area is larger than the minimum metal area which becomes an exposure limit, and controls the metal area to a limit while taking a minimum metal area error into consideration based on a design rule to be applied to semiconductors. Consequently, the LSI can be set in high density and the productivity of semiconductors can be improved while properly preventing a minimum metal area error.

According to the first embodiment, the automatic wiring device 10 divides a metal region of which minimum metal area is to be checked, into rectangles, calculates an area of each divided rectangle, and calculates the total of areas of the rectangles. Therefore, even when wiring and via holes are overlapped to form a complex configuration of the metal area, the metal area can be divided into plural rectangles, and these divided metal areas can be easily calculated.

According to the first embodiment, when the metal area is determined to be smaller than the minimum metal area, the automatic wiring device 10 corrects the wiring of the LSI so that the metal area becomes equal to or larger than the minimum metal area. Therefore, a minimum metal area error does not occur in the check of the design rule after a wiring phase. Consequently, the wiring phase is not required to be performed again, and this contributes to shorten the LSI design period.

According to the first embodiment, when the metal area is determined to be smaller than the minimum metal area, the automatic wiring device 10 changes a type of via holes so that the metal area becomes equal to or larger than the minimum metal area. Therefore, the automatic wiring device 10 can correct the metal area without changing the wiring pattern, and minimize the influence of error correction to timings or the like. Consequently, this can contribute to shorten the LSI design period.

According to the first embodiment, when the metal area is determined to be smaller than the minimum metal area, the automatic wiring device 10 adds wiring so that the metal area becomes equal to or larger than the minimum metal area. Therefore, the automatic wiring device 10 can correct the metal area without substantially changing the wiring pattern and minimize the influence of error correction to the timings or the like. Consequently, this can contribute to shorten the LSI design period.

According to the first embodiment, when the metal area is determined to be smaller than the minimum metal area, the automatic wiring device 10 changes the wiring pattern so that the metal area becomes equal to or larger than the minimum metal area. Therefore, the automatic wiring device 10 can perform the entire correction of the metal area and this can contribute to shorten the LSI design period.

According to the first embodiment, the automatic wiring device 10 stores a parameter file that designates correction methods of correcting the wiring of the LSI. When the metal area is determined to be smaller than the minimum metal area, the automatic wiring device 10 reads the parameter file, and corrects the LSI wiring by a correction method designated by the parameter file. Therefore, the automatic wiring device 10 can correct the minimum metal area error within a short time, and this can contribute to shorten the LSI design period.

According to the first embodiment, the automatic wiring device 10 stores a parameter file that designates a net as an object to be corrected. The automatic wiring device 10 reads from the parameter file a correction method corresponding to a net in which the metal area is determined to be smaller than the minimum metal area, and corrects the LSI wiring by a method designated by the parameter file. Therefore, the automatic wiring device 10 can correct the minimum metal area error to meet the intention of a designer by designating the net, and this can contribute to improve the efficiency of the LSI design.

According to the first embodiment, the automatic wiring device 10 designates a net to be corrected by any one of or plural units of one net unit, a net type unit, a used-wiring layer unit, a fan-out unit, and a wiring region unit. Therefore, by preparing parameters in a net unit, a net type, a used-wiring layer, a fan-out, and a wiring region, the automatic wiring device 10 can specify more detailed instructions, and this can contribute to improve the efficiency of the LSI design.

According to the first embodiment, the automatic wiring device 10 stores a parameter file that designates a wiring region as an object to which the correction method is to be applied. The automatic wiring device 10 reads from the parameter file a correction method corresponding to a wiring region in which the metal area is determined to be smaller than the minimum metal area, and corrects the LSI wiring by a method designated by the parameter file. Therefore, the automatic wiring device 10 can correct the minimum metal area error to meet the intention of a designer by designating the wiring region, and this can contribute to improve the efficiency of the LSI design.

According to the first embodiment, the automatic wiring device 10 stores a parameter file that designates a wiring unit as an object to which the correction method is to be applied. The automatic wiring device 10 reads from the parameter file a correction method corresponding to a wiring layer unit in which the metal area is determined to be smaller than the minimum metal area, and corrects the LSI wiring by a method designated by the parameter file. Therefore, the automatic wiring device 10 can correct the minimum metal area error to meet the intention of a designer by designating the wiring layer unit, and this can contribute to improve the efficiency of the LSI design.

According to the first embodiment, the automatic wiring device 10 designates a net unit as an object to be corrected, and stores a parameter file that designates a priority order of each object to be corrected. When the metal area is determined to be smaller than the minimum metal area, the automatic wiring device 10 corrects the SLI wiring in the order of high priority of application. Therefore, by designating the priority order, the automatic wiring device 10 can specify more detailed instructions, and this can contribute to improve the efficiency of the LSI design.

While an exemplary embodiment of the present invention has been explained above, the invention can be carried out by various different embodiments other than the above embodiment. As another embodiment included in the present invention, a second embodiment of the invention is explained below.

(1) System Configuration or the Like

Respective constituent elements of respective devices depicted in the drawings are functionally conceptual, and physically the same configuration illustrated in the drawings is not always necessary. That is, the specific mode of distribution and integration of the devices are not limited to the illustrated ones, and all or a part thereof can be functionally or physically distributed or integrated in an arbitrary unit, according to various kinds of load and the status of use. For example, the minimum-metal-area checking unit 14c and the minimum-metal-area correcting unit 14d can be integrated. Furthermore, all or an arbitrary part of processing functions performed by the respective devices can be realized by a central processing unit (CPU) and a program analyzed and executed by the CPU, or can be realized as hardware by a wired logic.

(2) Programs

Figure 15:
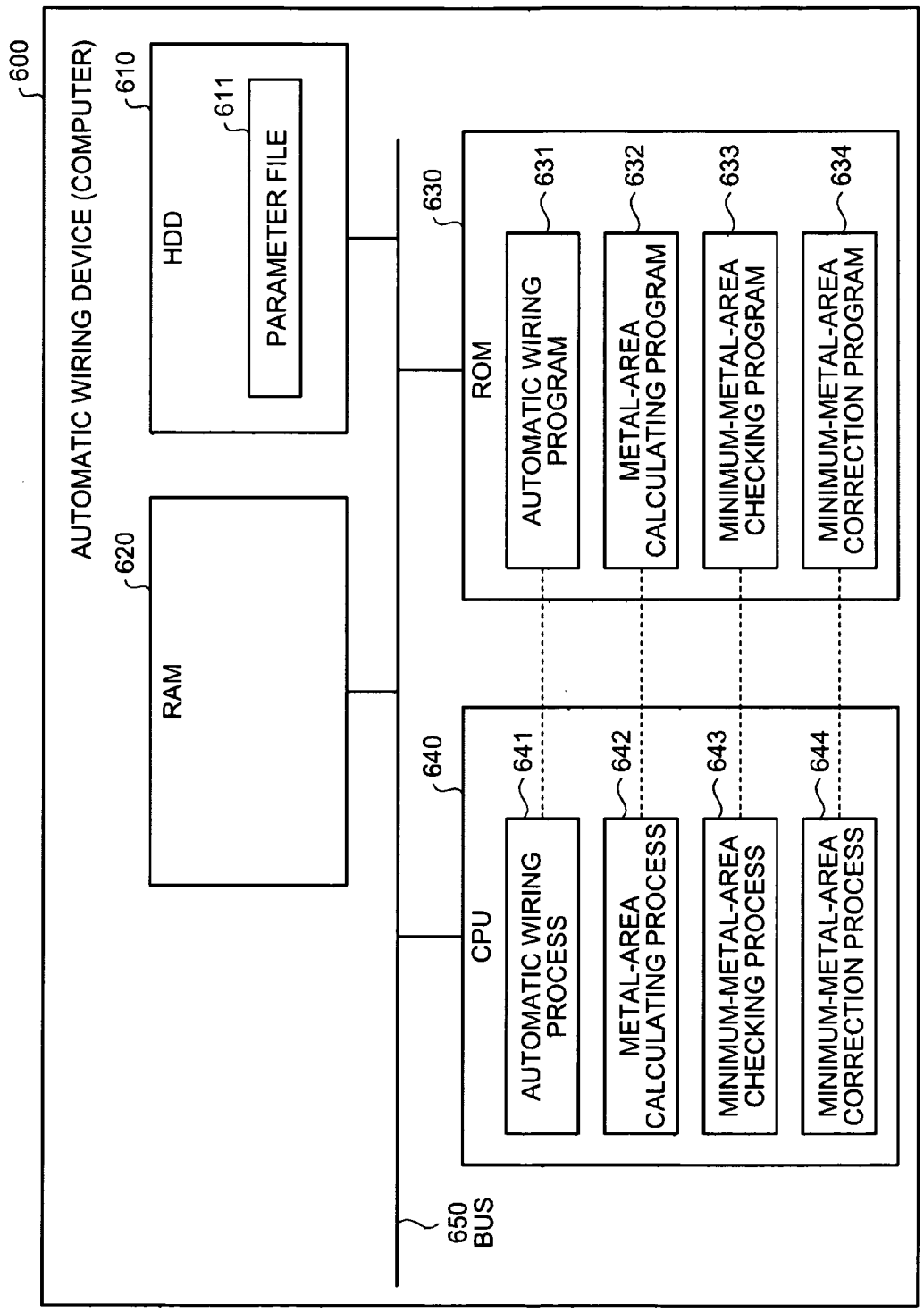
FIG. 15 depicts a computer that executes an automatic wiring program.

Various processes explained in the above embodiments can be achieved by executing programs prepared in advance by a computer. One example of a computer that executes the programs having functions similar to those of the above embodiments is explained with reference to FIG. 15. FIG. 15 depicts a computer that executes an automatic wiring program.

As depicted in FIG. 15, a computer 600 as the automatic wiring device includes a hard disk drive (HDD) 610, a random access memory (RAM) 620, a read only memory (ROM) 630, and a CPU 640 that are connected to each other by a bus 650.

The ROM 630 stores the automatic wiring program that performs functions similar to those of the above embodiments. That is, as illustrated in FIG. 15, the ROM 630 stores in advance an automatic wiring program 631, a metal-area calculating program 632, a minimum-metal-area checking program 633, and a minimum-metal-area correction program 634. The programs 631 to 634 can be suitably integrated or distributed in a similar manner to that of constituent elements of the automatic wiring device illustrated in FIG. 1.

The CPU 640 reads the programs 631 to 634 from the ROM 630 and executes these programs. As a result, as illustrated in FIG. 15, the programs 631 to 534 function as an automatic wiring process 641, a metal-area calculating process 642, a minimum-metal-area checking process 643, and a minimum-metal-area correction process 644, respectively. The processes 641 to 644 correspond to the automatic wiring unit 14a, the metal-area calculating unit 14b, the minimum-metal-area checking unit 14c, and the minimum-metal-area correcting unit 14d, respectively.

As illustrated in FIG. 15, the HDD 610 includes a parameter file 611. The CPU 640 reads data from the parameter file 611, stores the data into the RAM 620, and performs the process based on the data stored in the RAM 620.

The automatic wiring device according to the embodiment achieves high density of an LSI and improves the productivity of semiconductors while properly preventing a minimum metal area error.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. An automatic wiring device comprising:
   a wiring unit that performs wiring based on connection information of a circuit in an integrated circuit;
   a parameter-file storage unit that stores a parameter file that designates a correction method of correcting the wiring and a priority order for each of objects in the integrated circuit;
   a wiring-metal-area calculating unit that divides wires and via holes obtained by the wiring into a plurality of blocks and calculates a metal area included in each of the blocks;
   a minimum-metal-area determining unit that determines whether the metal area calculated by the wiring-metal-area calculating unit is smaller than a minimum metal area as a predetermined threshold value; and
   a minimum-metal-area correcting unit that reads the parameter file stored in the parameter-file storage unit, and corrects the wiring so that the metal area becomes equal to or larger than the minimum metal area in accordance with the correction method and the priority order designated by the parameter file, when the minimum-metal-area determining unit determines that the metal area is smaller than the minimum metal area, wherein the minimum-metal-area correcting unit repeats a process of correcting the wiring of the integrated circuit until there is no minimum metal area error.

2. The automatic wiring device according to claim 1, wherein the wiring-metal-area calculating unit divides a region of the metal area into rectangles, calculates an area of each divided rectangle, and calculates a total of areas of the rectangles.

3. The automatic wiring device according to claim 1, wherein when the minimum-metal-area determining unit determines that the metal area is smaller than the minimum metal area, the minimum-metal-area correcting unit adds wiring so that the metal area becomes equal to or larger than the minimum metal area.

4. The automatic wiring device according to claim 1, wherein the parameter-file storage unit stores a parameter file that designates a net as an object to which the correction method is to be applied, and
the minimum-metal-area correcting unit reads, from the parameter file stored in the parameter-file storage unit, the correction method corresponding to a net in which the metal area is determined to be smaller than the minimum metal area by the minimum-metal-area determining unit, and corrects wiring of the integrated circuit by a method designated by the parameter file.

5. The automatic wiring device according to claim 1, wherein the parameter-file storage unit stores a parameter file that designates a net type representing an attribute of the net as an object to which the correction method is to be applied, and
the minimum-metal-area correcting unit reads, from the parameter file stored in the parameter-file storage unit, the correction method corresponding to a wiring layer in which the metal area is determined to be smaller than the minimum metal area by the minimum-metal-area determining unit, and corrects wiring of the integrated circuit by a method designated by the parameter file.

6. The automatic wiring device according to claim 1, wherein the parameter file storage unit stores a parameter file that designates a wiring layer as an object to which the correction method is to be applied, and
the minimum-metal-area correcting unit reads, from the parameter file stored in the parameter-file storage unit, the correction method corresponding to a wiring layer in which the metal area is determined to be smaller than the minimum metal area by the minimum-metal-area determining unit, and corrects wiring of the integrated circuit by a method designated by the parameter file.

7. The automatic wiring device according to claim 1, wherein the parameter-file storage unit stores a parameter file that designates a fan-out number representing branching of wiring driven by an output of cells as an object to which the correction method is to be applied, and
the minimum-metal-area correcting unit reads, from the parameter file stored in the parameter-file storage unit, the correction method corresponding to a wiring layer in which the metal area is determined to be smaller than the minimum metal area by the minimum-metal-area determining unit, and corrects wiring of the integrated circuit by a method designated by the parameter file.

8. The automatic wiring device according to claim 1, wherein the parameter-file storage unit stores a parameter file that designates a wiring region represented by XY coordinates as an object to which the correction method is to be applied, and
the minimum-metal-area correcting unit reads, from the parameter file stored in the parameter-file storage unit, the correction method corresponding to a wiring layer in which the metal area is determined to be smaller than the minimum metal area by the minimum-metal-area determining unit, and corrects wiring of the integrated circuit by a method designated by the parameter file.

9. An automatic wiring method comprising:
performing wiring based on connection information of a circuit in an integrated circuit;
dividing, using a computer, wires and via holes obtained by the wiring into a plurality of blocks;
calculating, using the computer, a metal area included in each of the blocks;
determining, using the computer, whether the metal area calculated at the calculating is smaller than a minimum metal area as a predetermined threshold value;
reading a parameter file stored in a storage unit when determined that the metal area is smaller than the minimum metal area, the parameter file designating a correction method of correcting the wiring and a priority order for each of objects in the integrated circuit; and
correcting the wiring so that the metal area becomes equal to or larger than the minimum metal area in accordance with the correction method and the priority order designated by the parameter file, wherein
the correcting includes repeating a process of correcting the wiring of the integrated circuit until there is no minimum metal area error.

10. A non-transitory computer readable storage medium containing instructions for automatic wiring that, when executed by a computer, cause the computer to perform:
performing wiring based on connection information of a circuit in an integrated circuit;
dividing wires and via holes obtained by the wiring into a plurality of blocks;
calculating a metal area included in each of the blocks;
determining whether the metal area calculated at the calculating is smaller than a minimum metal area as a predetermined threshold value;
reading a parameter file stored in a storage unit when determined that the metal area is smaller than the minimum metal area, the parameter file designating a correction method of correcting the wiring and a priority order for each of objects in the integrated circuit; and
correcting the wiring so that the metal area becomes equal to or larger than the minimum metal area in accordance with the correction method and the priority order designated by the parameter file, wherein
the correcting includes repeating a process of correcting the wiring of the integrated circuit until there is no minimum metal area error.

* * * * *